US012660584B2

(12) United States Patent
Huang

(10) Patent No.: US 12,660,584 B2
(45) Date of Patent: Jun. 16, 2026

(54) WAFER REWIRING DOUBLE VERIFICATION STRUCTURE, AND MANUFACTURING METHOD AND VERIFICATION METHOD THEREOF

(71) Applicants: CHIPMORE TECHNOLOGY CORPORATION LIMITED, Suzhou (CN); HEFEI CHIPMORE TECHNOLOGY CO., LTD., Hefei (CN)

(72) Inventor: Wenjie Huang, Suzhou (CN)

(73) Assignees: CHIPMORE TECHNOLOGY CORPORATION LIMITED, Suzhou (CN); HEFEI CHIPMORE TECHNOLOGY CO., LTD., Heifei (CN)

( * ) Notice: Subject to any disclaimer, the term of this patent is extended or adjusted under 35 U.S.C. 154(b) by 373 days.

(21) Appl. No.: 18/273,647

(22) PCT Filed: Nov. 23, 2021

(86) PCT No.: PCT/CN2021/132278
§ 371 (c)(1),
(2) Date: Jul. 21, 2023

(87) PCT Pub. No.: WO2022/213613
PCT Pub. Date: Oct. 13, 2022

(65) Prior Publication Data
US 2024/0079271 A1       Mar. 7, 2024

(30) Foreign Application Priority Data
Apr. 9, 2021    (CN) .......................... 202110381030.1

(51) Int. Cl.
H10W 20/00        (2026.01)
H10P 74/20        (2026.01)
(Continued)

(52) U.S. Cl.
CPC ....... *H10W 20/0698* (2026.01); *H10P 74/207* (2026.01); *H10W 70/09* (2026.01); *H10W 72/923* (2026.01); *H10W 72/942* (2026.01)

(58) Field of Classification Search
CPC ... H01L 21/76895; H01L 22/14; H01L 24/05; H01L 24/19
See application file for complete search history.

(56) References Cited

U.S. PATENT DOCUMENTS

| | | | |
|---|---|---|---|
| 6,505,333 | B1 | 1/2003 | Tanaka |
| 2003/0077529 | A1 | 4/2003 | Berndt |

(Continued)

FOREIGN PATENT DOCUMENTS

| | | |
|---|---|---|
| CN | 108336052 A | 7/2018 |
| CN | 108766958 A | 11/2018 |

(Continued)

*Primary Examiner* — Mohammad M Choudhry
(74) *Attorney, Agent, or Firm* — Birch, Stewart, Kolasch & Birch, LLP

(57) ABSTRACT

The present invention discloses a wafer rewiring double verification structure, and a manufacturing method and a verification method thereof, wherein the wafer rewiring double verification structure includes: a die having a substrate, a plurality of pads and a passivation layer; a plurality of rewiring modules; and a gap portion formed between every two adjacent rewiring modules. A dielectric module is disposed on each rewiring module, and is provided with an inclined surface; and an electroplated layer is disposed on the inclined surface. According to the present invention, functional verification can be performed on different rewiring modules on the same wafer in one manufacturing process.

6 Claims, 4 Drawing Sheets

(51) Int. Cl.
  *H10W 70/09*          (2026.01)
  *H10W 72/90*          (2026.01)

(56)                    References Cited

U.S. PATENT DOCUMENTS

2005/0161775  A1*    7/2005  Funada .................... H05K 3/28
2009/0243118  A1*   10/2009  Akiba .................... H01L 22/14
                                                        257/773

FOREIGN PATENT DOCUMENTS

CN          111799245  A  *  10/2020   ............ H01L 21/50
CN          113113388  A      7/2021
JP          2001-274254  A    10/2001
JP          2001-282885  A    10/2001
JP          2006-202882  A     8/2006
JP          2008-227189  A     9/2008

* cited by examiner 700
700
70
30
103
102
101

700
20
20
70
30
103
102
101

20
200
20
30
103
102
101

400
20
30
103
102
101

WAFER REWIRING DOUBLE VERIFICATION STRUCTURE, AND MANUFACTURING METHOD AND VERIFICATION METHOD THEREOF

TECHNICAL FIELD

The present invention relates to the field of chip packaging technologies, and in particular to a wafer rewiring double verification structure, and a manufacturing method and a verification method thereof.

BACKGROUND ART

As a core component for modern electronic products, a chip has a very complex design and production process featured with long cycle and high cost. As a result, different functional modules are usually planned on the same chip during IC design, and surface routing or packaging is then changed by means of rewiring, thereby adapting to diversified applications of products and minimizing cost to acquire profits.

In an engineering phase of a project, it is generally necessary to perform various rewiring on chips for the diversified applications. Hence, it is required to perform multi-verification on the chips. In the prior art, the above multi-verification of the chips is generally completed in different frameworks and different devices, and meanwhile, multiple sets of solutions mean multiple wafers, multiple manufacturing processes, multiple conduction, and multiple customizations, which not only leads to the increase and waste of manpower, resources, and design cost, but also adversely affects the comparison of verification data.

SUMMARY OF THE INVENTION

An object of the present invention is to provide a wafer rewiring double verification structure to overcome the shortcomings of the prior art, and the structure can enable functional verification to be performed on different forms of rewiring modules on the same wafer in one manufacturing process.

An embodiment of the present invention discloses a wafer rewiring double verification structure, including: a die having a substrate, as well as a plurality of pads and a passivation layer which are disposed on the substrate, wherein the passivation layer is provided with a plurality of passivation-layer openings that are disposed opposite to the pads and expose the corresponding pads to the outside:

a plurality of rewiring modules disposed on the passivation layer and connected to the corresponding pads, wherein a gap portion is formed between every two adjacent rewiring modules;

a dielectric module disposed on each rewiring module, wherein an inclined surface inclined towards a direction of the gap portion is formed on the dielectric module; and an electroplated layer disposed on the inclined surface of the dielectric module.

Further, the dielectric module is disposed on a side of an upper surface of the corresponding rewiring module close to the corresponding gap portion, and one end of each inclined surfaces extends to the corresponding gap portion.

Further, an included angle between the inclined surface of the dielectric module and a horizontal plane is not less than 45°.

Further, the dielectric module is a photosensitive polymer organic material disposed on the rewiring module, and the material specifically includes, but is not limited to, polybenzoxazole, polyimide and polyphenylcyclobutene.

Further, the dielectric module is manufactured by heating, curing and shrinking of the photosensitive polymer organic material.

A manufacturing method of the wafer rewiring double verification structure as defined includes the following steps of:

providing a die;

performing rewiring on the die and then forming a plurality of rewiring modules on the die, wherein each rewiring module is each connected to a corresponding pad, and a gap portion is formed between every two adjacent rewiring modules;

covering the rewiring modules and the gap portion with a dielectric layer, and removing part of the dielectric layer outside a preset position; forming a dielectric module disposed on the rewiring module from a remaining dielectric layer at the preset position;

forming, on the dielectric module, an inclined surface inclined towards the corresponding gap portion; and forming an electroplated layer on each inclined surface.

Further, forming the electroplated layer on each inclined surface specifically includes the following steps of:

covering an upper surface of the dielectric module, part of an upper surface of the rewiring module, and an upper surface of the gap portion, with an upper metallization layer;

covering the upper metallization layer with an upper photoresist layer;

removing part of the upper photoresist layer to form an upper pane, wherein part of each inclined surface is exposed from the corresponding upper pane to the outside;

forming an electroplated layer in the upper pane; and removing the remaining upper photoresist layer and the upper metallization layer outside a coverage of the electroplated layer.

Further, performing the rewiring on the die and then forming the plurality of rewiring modules on the die includes the following steps of:

forming a lower metallization layer on the die, and forming a lower photoresist layer on the lower metallization layer;

removing part of the lower photoresist layer to form a plurality of lower panes, wherein each lower pane is internally provided with a corresponding pad that is exposed from the lower pane to the outside;

electroplating interiors of the lower panes with an upper metallization layer to form the rewiring modules; and removing the remaining lower photoresist layer and the lower metallization layer outside coverages of the rewiring modules.

Further, covering the rewiring module and the gap portion with the dielectric layer, removing part of the dielectric layer outside the preset position, and forming the dielectric module disposed on the rewiring module, from the remaining dielectric layer at the preset position, includes the following steps of;

forming the dielectric layer on the rewiring modules and the gap portion by means of coating;

removing the dielectric layer outside the preset position by means of exposure development; and forming the dielectric module by curing and shrinking of the dielectric layer at the preset position by means of high-temperature curing, wherein the inclined surface is generated during the curing and shrinking.

A verification method of the wafer rewiring double verification structure as defined includes the following steps of:

performing functional verification on each rewiring module separately;

melting the electroplated layer to allow the molten electroplated layer to flow into the gap portion along the inclined surface, such that every two adjacent rewiring modules are connected to form anew circuit structure; and performing functional verification on the new circuit structure disposed on the rewiring modules that are connected into a whole.

Compared with the prior art, in the wafer rewiring double verification structure as disclosed in the embodiments of the present invention, the dielectric layer is formed on the rewiring modules; the inclined surface inclined to the gap portion between every two adjacent rewiring modules is formed on the dielectric layer; the electroplated layer is disposed on the inclined surface; the electroplated layer is molten under control, and then is allowed to flow along the inclined surface into each gap portion and to finally cool down to form a conduction layer connecting every two adjacent rewiring modules, such that the functional verification can be performed on different forms of rewiring modules on the same wafer in one manufacturing process. Compared with the multi-verification method in the prior art, in which verification is required to be completed in different frameworks and different devices, the present invention saves manpower and resources and reduces design cost.

Figure 1:
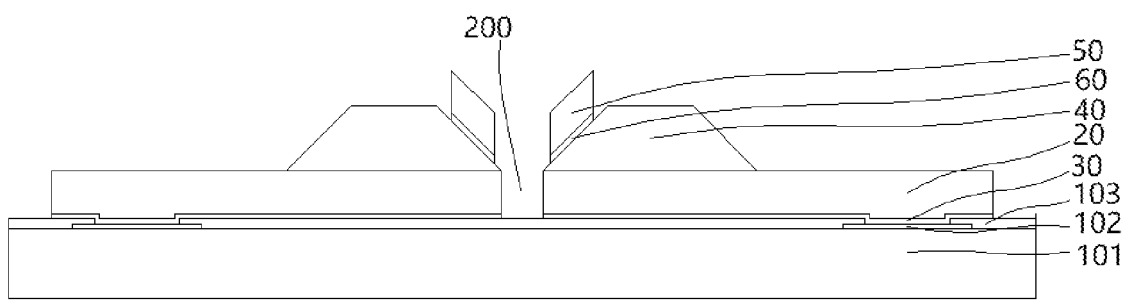
FIG. 1 is a schematic diagram of a wafer rewiring double verification structure according to an embodiment of the present invention.

Description of reference numerals; 10—die, 101—substrate, 102—pad, 103—passivation layer, 104—passivation-layer opening, 20—rewiring module, 200—gap portion, 30—lower metallization layer, 40—dielectric module, 400—dielectric layer, 401—inclined surface, 50—electroplated layer, 500—metal conduction layer, 60—upper metallization layer, 70—lower photoresist layer, 700—lower pane, 80—upper photoresist layer, and 800—upper optical resistance layer.

DETAILED DESCRIPTION

The following embodiments described with reference to the accompanying drawings are exemplary only for the purpose of explaining the present invention, and should not be interpreted as limiting the present invention.

In embodiments of the present invention, as shown in FIG. 1, a wafer rewiring double verification structure is disclosed, including a die 10, a plurality of rewiring modules 20 disposed on the die 10, dielectric modules 40 disposed on the rewiring modules 20, and electroplated layers 50. A gap portion 200 is disposed between every two adjacent rewiring modules 20; each dielectric module 40 is provided with an inclined surface 401 inclined towards the direction of the corresponding gap portion 200; and the electroplated layer 50 is disposed on the inclined surface 401.

In an initial state, the electroplated layer 50 is disposed, in a solidified state, on the inclined surface 401; here, every two adjacent rewiring modules 20 are separated by the gap portion 200; and functional verification is performed on each rewiring module 20 separately. After the functional verification of each individual rewiring module 20 separately, the electroplated layers 50 are molten, and then the molten electroplated layers 50 move along the inclined surfaces 401 to the gap portion 200 and to finally cool down and solidify in the gap portion 200 to form a metal conduction layer 500 connecting every two adjacent rewiring modules 20. The metal conduction layer 500 allows connection of every two adjacent rewiring modules 20 to form a new circuit structure, such that the functional verification can be performed on chips designed with different circuit structures in the same framework and device.

Specifically, the die 10 has a substrate 101, as well as a plurality of pads 102 and a passivation layer 103 which are disposed on the substrate 101. The passivation layer 103 is provided with a plurality of passivation-layer openings 104 that are disposed opposite to the pads 102 and expose the corresponding pads to the outside. The substrate 101 is a wafer body; the pads 102 are each a metal layer disposed on the wafer body; and the material of the metal layer includes but is not limited to aluminum, copper and other metals and alloys.

The passivation layer 103 serves as a protective layer on the surface of the die 10, and its material includes but is not limited to an inorganic film material such as silicon nitride and silicon oxide, or a photosensitive organic polymer material such as polyimide with good dielectric properties. The passivation layer 103 covers the substrate 101; openings 104 in the passivation layer for exposing the pads 102 to the outside are generally sized to be smaller than the size of the pads 102, such that part of the passivation layer 104 covers the pads 102, and the passivation layer 104 covers the edge position of each pad 102.

The plurality of rewiring modules 20 is disposed on the passivation layer 103 and connected to the corresponding pads 102; and the rewiring modules 20 are metal circuits connected and fixed to the pads 102 to serve to expand the pads 102 and optimize connection points for the pads 102. The gap portion 200 is formed between every two adjacent rewiring modules 20. The rewiring modules 20 are metal circuits formed on the passivation layer 103 by an electroplating process, and are made of a material including but not limited to copper, nickel, tin, silver, gold, aluminum or other metals, or a combination layer formed thereby by sequential superimposition, such as copper-nickel-gold.

It should be noted that, in order to achieve the formation of the rewiring modules 20, a lower metallization layer 30 is laid on the passivation layer 103 before the rewiring modules 20 are produced. The lower metallization layer 30 serves as a substrate for forming the rewiring modules 20, and part of the lower metallization layer 30 also covers the pads 102. In the present embodiment, the lower metallization layer 30 is a combination layer formed by sequentially superimposing an adhesion layer/barrier layer and a seed layer. The material of the adhesion layer/barrier layer includes but is not limited to titanium, titanium-tungsten or other metal alloys or compounds of titanium. The material of the seed layer includes but is not limited to copper, gold, or other metals. The rewiring modules 20 are molded on the lower metallization layer 30 by an electroplating process.

Each rewiring module 20 separately forms an independent path, and it is required to perform functional verification on each rewiring module 20 separately. Meanwhile, every two adjacent rewiring modules 20 are conducted to form an integrated rewiring module, which then forms a new path. Therefore, it is also necessary to perform functional verification on the integrated rewiring modules 20 after every two adjacent rewiring modules 20 are connected. It should be noted that the double verification structure here is mainly suitable for the rewiring modules, the adjacent two of which can form a new path by simple connection. In the prior art, when functional verification is performed on such rewiring modules, it is required to prepare two sets of rewiring modules on two separate wafers, and after functional verification on the two rewiring modules separately, the two sets of rewiring modules are combined on a new wafer to form a new integrated rewiring module, which is then subjected to functional verification. Such a multi-verification method generally needs to be completed in different frameworks and different devices, and multiple sets of solutions mean multiple wafers, multiple manufacturing processes, multiple conduction, and multiple customizations, which not only leads to the increase and waste of manpower, resources, and design cost, but also adversely affects the comparison of verification data.

In an embodiment of the present invention, the dielectric modules 40 are formed on the rewiring modules 20, and the inclined surface 401 inclined towards the direction of the gap portion 200 is formed on each dielectric module 40. Each dielectric module 40 is disposed on a side of an upper surface of the corresponding rewiring module 20 close to the corresponding gap portion 200, and one end of each inclined surface 401 extends to the corresponding gap portion 200. The electroplated layer 50 is formed on the inclined surface 401. The material of the electroplated layer 50 is a low-melting-point metal such as tin. After high-temperature melting, the electroplated layers 50 can flow along the inclined surfaces 401 to the direction of the gap portion 200 and finally cool down and solidify in the gap portion 200 to form the metal conduction layer 500 connecting every two adjacent rewiring modules 20. Before the electroplated layers 50 are formed in the gap portion 200, each rewiring module 20 is an independent unit capable of achieving independent functions, and after the electroplated layers 50 are formed in the gap portion 200, two of the rewiring modules 20 form a whole and have an independent function.

In the present embodiment, in order to facilitate the formation of the electroplated layer 50 on the dielectric module 40, the upper metallization layer 60 is further provided between the electroplated layer 50 and the dielectric module 40. The upper metallization layer 60 serves as a substrate for forming the electroplated layer 50, and is a combination layer formed by sequentially superimposing an adhesion layer/barrier layer and a seed layer. The material of the adhesion layer/barrier layer includes but is not limited to titanium, titanium-tungsten or other metal alloys or compounds of titanium, and the material of the seed layer includes but is not limited to copper, gold or other metals. The thickness of the electroplated layer 50 is generally 3-30 μm, and the electroplated layer 50 is required to have such a volume that the molten tin components can be ensured to be filled in the gap portion 200 to connect the rewiring modules 20 on both sides to achieve conduction.

The dielectric modules 40 are formed by high-temperature curing and shrinking of the dielectric layer 400 disposed on the rewiring modules 20, and the inclined surfaces 401 are each formed by automatic shrinking of the dielectric layer 400 in a high-temperature curing process. The material of the dielectric layer 400 is a photosensitive polymer organic material, which specifically includes but is not limited to polybenzoxazole (PBO), polyimide, polyphenyl cyclobutene (BCB). In order to improve the flow of the electroplated layers 50 on the dielectric modules 40 to the gap portion 200, the included angle between the inclined surface 401 on each dielectric module 40 and the horizontal plane is not less than 45°. In order to enable an inclined angle of the inclined surface 401 formed on each dielectric module 40 to be not less than 45° conveniently, the thickness of the dielectric layer 400 is 10-40 μm before the high-temperature curing and shrinkage. The inclined surface 401 of each dielectric module 40 formed from the dielectric layer 400 having the above thickness after high-temperature curing and shrinking has one end capable of extending to the corresponding gap portion 200; meanwhile, the inclined angle of the formed inclined surface 401 is not less than 45°; and the thickness of each molded dielectric module 40 is in the range of 5-20 μm.

In an initial state, the electroplated layers 50 is disposed, in a solidified state, on the inclined surfaces 401; then, functional verification is performed on each rewiring module 20 separately; after verification of each individual rewiring module 20 separately, the electroplated layers 50 are molten, and then the molten electroplated layers 50 flow along the inclined surfaces 401 towards the direction of each gap portion 20; and the electroplated layers 50 are solidified in each gap portion 200 to form a conduction member connecting the every two adjacent rewiring modules 20, thereby superimposing the two individual rewiring modules 20 to from an integrated rewiring module, which can be subjected to new functional verification on the original device. Compared with the prior art, the present invention saves manpower and resources, and reduces design cost.

Another embodiment of the present invention further discloses a manufacturing method of the wafer rewiring double verification structure as defined above. The method includes the following steps.

Figure 2:
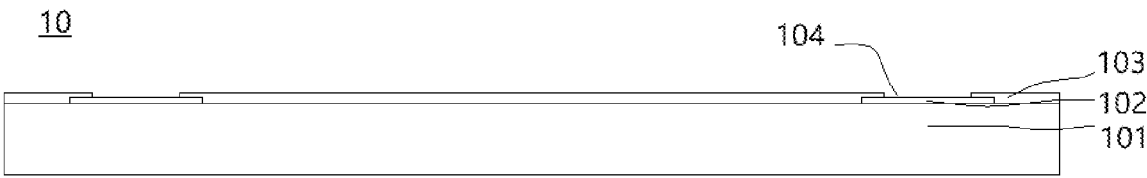
FIG. 2 to FIG. 15 sequentially show a flowchart of a molding method of a wafer rewiring double verification structure according to an embodiment of the present invention.

In S100, as shown in FIG. 2, a die 10 is provided. The die 10 includes a substrate 101; pads 102 and a passivation layer 103 are formed on the upper surface of the substrate 101; the pads 102 are exposed to the outside from passivation-layer openings 104 in the passivation layer 103.

Figure 6:
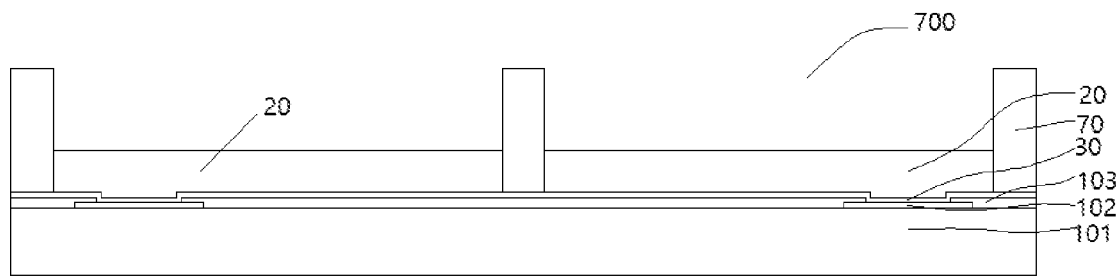
Figure 7:
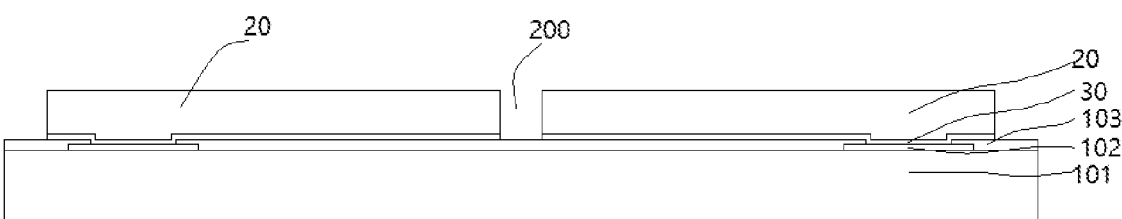

In S200, as shown in FIGS. 6 and 7, rewiring is performed on the die 10, and then, a plurality of rewiring modules 20 is formed on the die 10. Each rewiring module 20 is connected to the corresponding pad 102, and a gap portion 200 is formed between every two adjacent rewiring modules 20.

Figure 8:
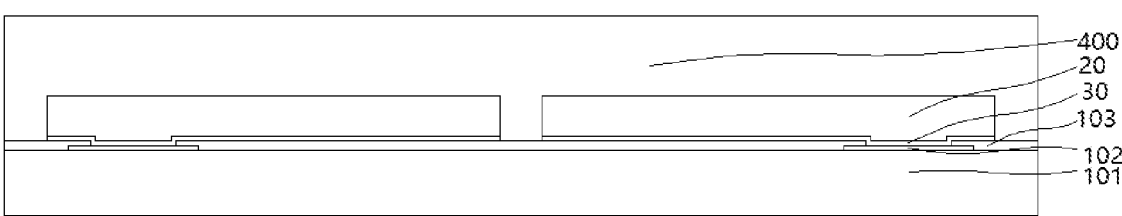
Figure 9:
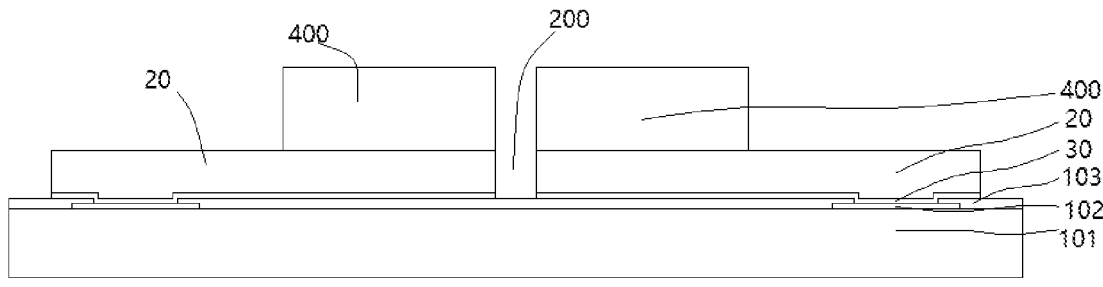
Figure 10:
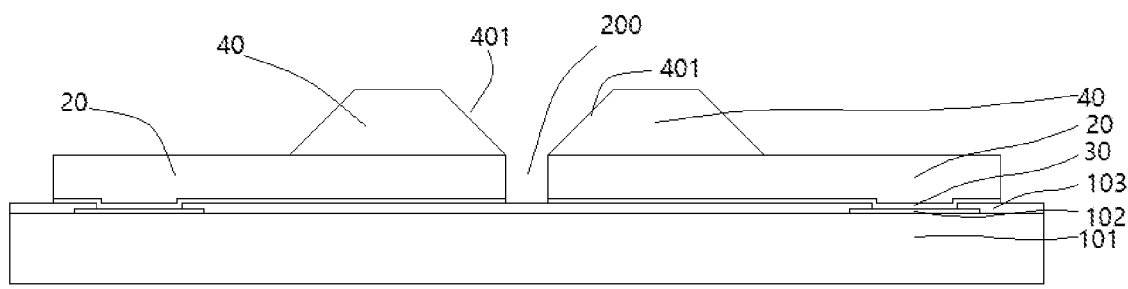

In S300, as shown in FIGS. 8-10, the rewiring modules 20 and the gap portions 200 are covered with a dielectric layer 400, part of the dielectric layer outside preset positions is removed, and dielectric modules 40 disposed on the rewiring modules are formed from the remaining dielectric layer at the preset positions.

In S400, an inclined surface 401 inclined towards the gap portion 200 is formed on each dielectric module 40.

In S500, as shown in FIGS. 11-15, an electroplated layer 50 is formed on each inclined surface 401.

S200, in which rewiring is performed on the die 10 to form the plurality of rewiring modules 20 on the die 10, each rewiring module 20 is connected to a corresponding pad 102, and a gap portion 200 is formed between every two adjacent rewiring modules 20, specifically includes the following steps.

Figure 3:
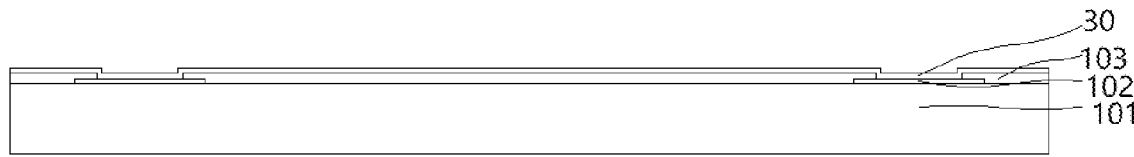
Figure 4:
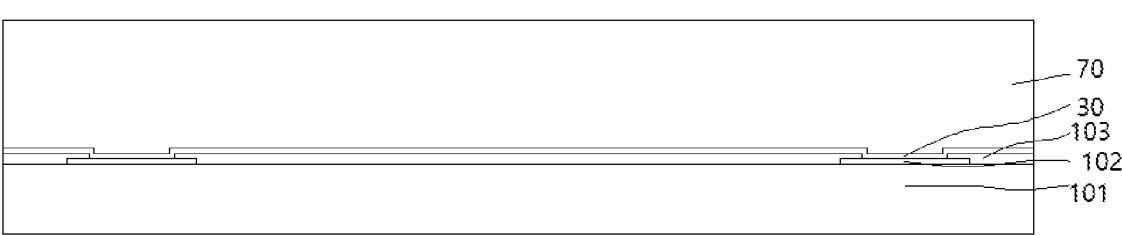

In S201, as shown in FIG. 3, a lower metallization layer 30 is formed on the die 10, and a lower photoresist layer 70 is formed on the lower metallization layer 30 (shown in FIG. 4).

Figure 5:
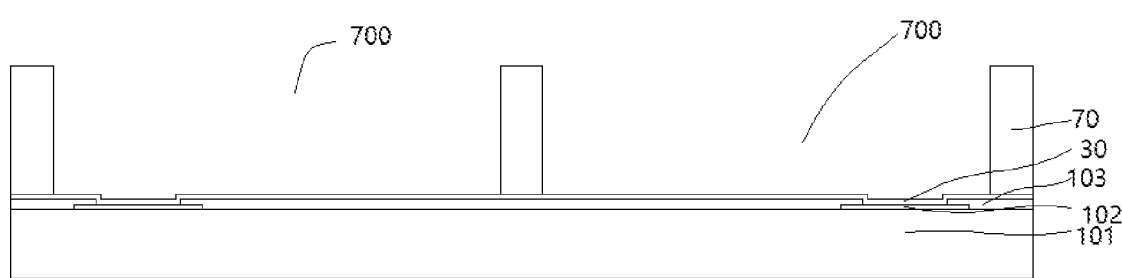

In S202, as shown in FIG. 5, part of the lower photoresist layer 70 is removed to form a plurality of lower panes 700, each of which is internally provided with the corresponding pad 102 that is exposed from the lower pane to the outside.

In S203, as shown in FIG. 6, each lower pane 700 is internally electroplated with a metallization layer to form the rewiring module 20.

In S204, as shown in FIG. 7, the remaining lower photoresist layer 70 and the lower metallization layer 30 outside the coverages of the rewiring modules are removed.

S300, in which the rewiring modules 20 and the gap portions 200 are covered with the dielectric layer 400, part of the dielectric layer outside the preset positions is removed, and the dielectric modules 40 disposed on the rewiring modules are formed from the remaining dielectric layer at the preset positions, specifically includes the following steps.

In S301, as shown in FIG. 8, the dielectric layer 400 is formed on the rewiring modules 20 and the gap portions 200 by means of coating. The thickness of the dielectric layer 400 is in the range of 10-40 μm.

In S302, as shown in FIG. 9, the dielectric layer outside the preset positions is removed by means of exposure development.

In S303, as shown in FIG. 10, the dielectric modules are formed by curing and shrinking of the dielectric layer on the preset positions by means of high-temperature curing. The inclined surfaces 401 are formed during the curing and shrinking. Of course, in another embodiment, the inclined surface 401 may also be provided on each dielectric module.

S500, in which the electroplated layer 50 is formed on each inclined surface 401, specifically includes the following steps.

Figure 11:
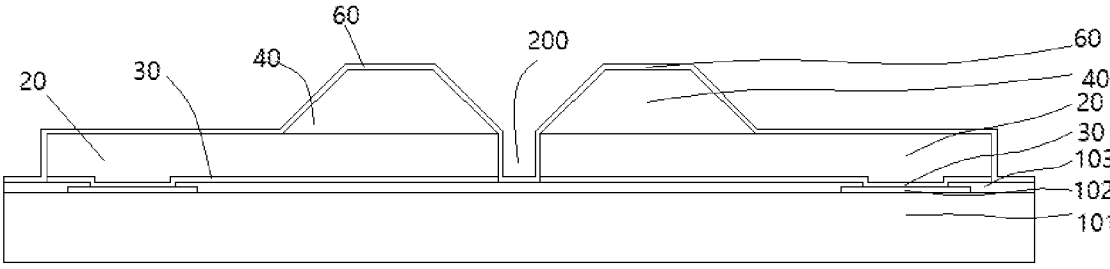
Figure 12:
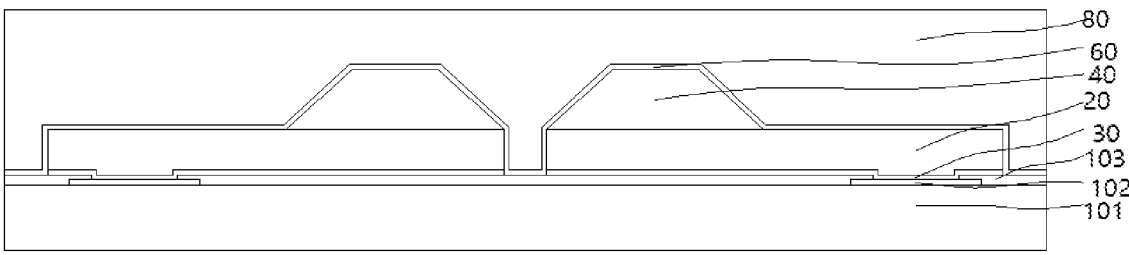

In S501, as shown in FIG. 11, an upper metallization layer 60 is formed on each dielectric module 40 and on part of each dielectric module 40, and an upper photoresist layer 80 is formed on the upper metallization layer 60 (as shown in FIG. 12).

Figure 13:
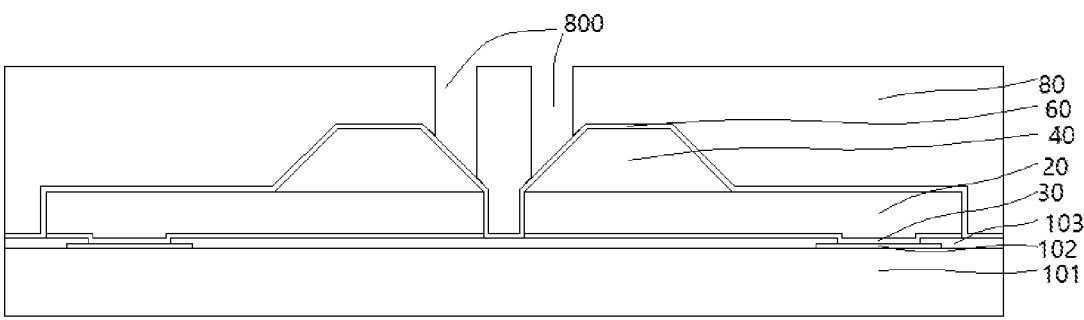

In S502, as shown in FIG. 13, part of the upper photoresist layer 80 is removed to form a plurality of upper panes 800. On each dielectric module 40, part of the upper photoresist layer 80 is removed to form upper panes 800 which are configured to expose the dielectric modules 40 to the outside.

Figure 14:
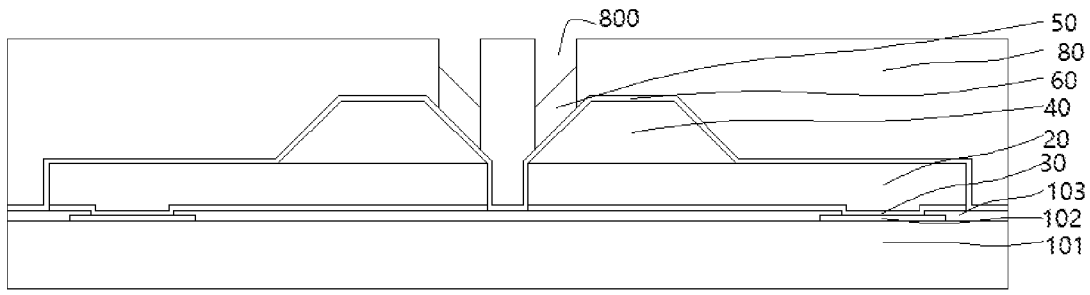

In S503, as shown in FIG. 14, each upper pane 800 is internally electroplated with a metal layer to form an electroplated layer 50.

Figure 15:
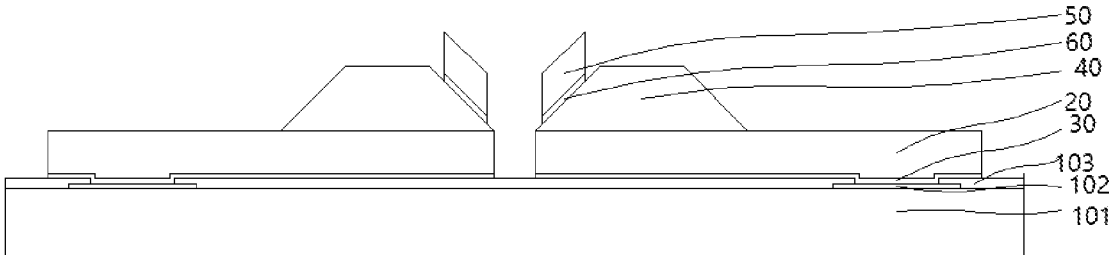

In S504, as shown in FIG. 15, the remaining upper photoresist layer 80 and the upper metallization layer 60 outside the coverages of the electroplated layers 50 are removed.

Another embodiment of the present invention further discloses a verification method of the wafer rewiring double verification structure as defined above. The method includes the following steps.

As shown in FIG. 15, functional verification is performed on each rewiring module 20 separately.

Figure 16:
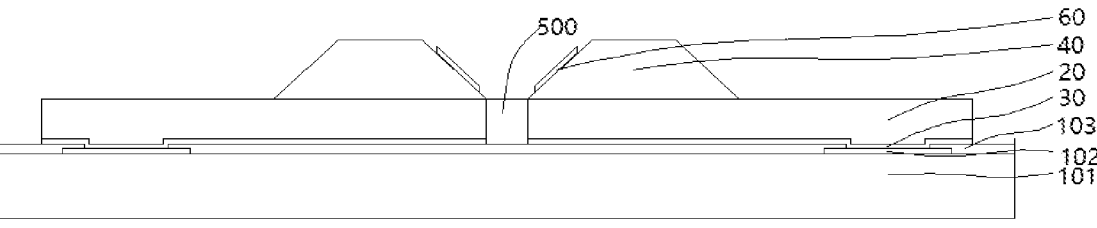
FIG. 16 is a schematic structural diagram of a molten electroplated layer 50 in a wafer rewiring double verification structure according to an embodiment of the present invention.

The electroplated layers 50 are molten and then the molten electroplated layers 50 flow into the gap portions along the inclined surfaces, such that every two adjacent rewiring modules 20 are connected to form a new circuit structure (shown in FIG. 16).

Functional verification is performed on the new circuit structure disposed on the rewiring modules 20 that are connected into a whole.

The construction, characteristics and effects of the present invention are explained in details above in accordance with the embodiments shown in the drawings. Described above only provide preferred embodiments of the present invention, the implementation scope of which is however not limited by these drawings. Any variations made in accordance with the concept of the present invention or any equivalent embodiments with equivalent changes achieved by modifications shall fall within the scope of protection of the present invention without departing from the spirit covered by the Description and the illustration.

What is claimed is:

1. A manufacturing method of the wafer rewiring double verification structure, comprising the following steps of:

providing a die, the die having a substrate, as well as a plurality of pads and a passivation layer which are disposed on the substrate, wherein the passivation layer is provided with a plurality of passivation-layer openings that are disposed opposite to the pads and expose the corresponding pads to the outside;

performing rewiring on the die and then forming a plurality of rewiring modules on the passivation layer, wherein each rewiring module is connected to a corresponding pad, and a gap portion is formed between every two adjacent rewiring modules;

covering the rewiring module and the gap portion with a dielectric layer, and removing part of the dielectric layer outside a preset position; forming a dielectric module disposed on the rewiring module from a remaining dielectric layer at the preset position;

forming, on the dielectric module, an inclined surface inclined towards the corresponding gap portion; and forming an electroplated layer on each inclined surface, wherein forming the electroplated layer on each inclined surface specifically comprises the following steps of:

covering an upper surface of the dielectric module, part of an upper surface of the rewiring module, and an upper surface of the gap portion, with an upper metallization layer;

covering the upper metallization layer with an upper photoresist layer;

removing part of the upper photoresist layer to form an upper pane, wherein part of each inclined surface is exposed from the corresponding upper pane to the outside;

forming an electroplated layer in the upper pane; and removing the remaining upper photoresist layer and the upper metallization layer outside a coverage of the electroplated layer.

2. The manufacturing method of the wafer rewiring double verification structure according to claim 1, wherein performing the rewiring on the die and then forming the plurality of rewiring modules on the die comprises the following steps of:

forming a lower metallization layer on the die, and forming a lower photoresist layer on the lower metallization layer;

removing part of the lower photoresist layer to form a plurality of lower panes, wherein each lower pane is internally provided with a corresponding pad that is exposed from the lower pane to the outside;

electroplating interiors of the lower panes with a metallization layer to form the rewiring modules; and removing the remaining lower photoresist layer and the lower metallization layer outside coverages of the rewiring modules.

3. The manufacturing method of the wafer rewiring double verification structure according to claim 1, wherein covering the rewiring module and the gap portion with the dielectric layer, removing part of the dielectric layer outside the preset position, and forming the dielectric module disposed on the rewiring module, from the remaining dielectric layer at the preset position, comprises the following steps of:

forming the dielectric layer on the rewiring module and the gap portion by means of coating;

removing the dielectric layer outside the preset position by means of exposure development; and forming the dielectric module by curing and shrinking of the dielectric layer at the preset position by means of high-temperature curing, wherein the inclined surface is generated during the curing and shrinking.

4. A verification method of the wafer rewiring double verification structure, the wafer rewiring double verification structure comprising:

a die having a substrate, as well as a plurality of pads and a passivation layer which are disposed on the substrate, wherein the passivation layer is provided with a plurality of passivation-layer openings that are disposed opposite to the pads and expose the corresponding pads to the outside;

a plurality of rewiring modules disposed on the passivation layer and connected to the corresponding pads, wherein a gap portion is formed between every two adjacent rewiring modules;

a dielectric module disposed on each rewiring module, wherein an inclined surface inclined towards a direction of the gap portion is formed on the dielectric module; and an electroplated layer disposed on the inclined surface of the dielectric module, wherein the verification method comprises the following steps of:

performing functional verification on each rewiring module separately;

melting the electroplated layer to allow the molten electroplated layer to flow into the gap portion along the inclined surface, such that every two adjacent rewiring modules are connected to form a new circuit structure; and performing functional verification on the new circuit structure disposed on the rewiring modules that are connected into a whole.

5. A manufacturing method of the wafer rewiring double verification structure, comprising the following steps of:

providing a die, the die having a substrate, as well as a plurality of pads and a passivation layer which are disposed on the substrate, wherein the passivation layer is provided with a plurality of passivation-layer openings that are disposed opposite to the pads and expose the corresponding pads to the outside;

performing rewiring on the die and then forming a plurality of rewiring modules on the passivation layer, wherein each rewiring module is connected to a corresponding pad, and a gap portion is formed between every two adjacent rewiring modules;

covering the rewiring module and the gap portion with a dielectric layer, and removing part of the dielectric layer outside a preset position; forming a dielectric module disposed on the rewiring module from a remaining dielectric layer at the preset position;

forming, on the dielectric module, an inclined surface inclined towards the corresponding gap portion; and forming an electroplated layer on each inclined surface, wherein performing the rewiring on the die and then forming the plurality of rewiring modules on the die comprises the following steps of:

forming a lower metallization layer on the die, and forming a lower photoresist layer on the lower metallization layer;

removing part of the lower photoresist layer to form a plurality of lower panes, wherein each lower pane is internally provided with a corresponding pad that is exposed from the lower pane to the outside;

electroplating interiors of the lower panes with a metallization layer to form the rewiring modules; and removing the remaining lower photoresist layer and the lower metallization layer outside coverages of the rewiring modules.

6. The manufacturing method of the wafer rewiring double verification structure according to claim 5, wherein covering the rewiring module and the gap portion with the dielectric layer, removing part of the dielectric layer outside the preset position, and forming the dielectric module disposed on the rewiring module, from the remaining dielectric layer at the preset position, comprises the following steps of:

forming the dielectric layer on the rewiring module and the gap portion by means of coating;

removing the dielectric layer outside the preset position by means of exposure development; and forming the dielectric module by curing and shrinking of the dielectric layer at the preset position by means of high-temperature curing, wherein the inclined surface is generated during the curing and shrinking.

* * * * *